US006948554B2

(12) United States Patent
Lee et al.

(10) Patent No.: US 6,948,554 B2
(45) Date of Patent: Sep. 27, 2005

(54) HEAT DISSIPATION ASSEMBLY WITH RESILIENT FASTENER

(75) Inventors: Hsieh Kun Lee, Tu-chen (TW); Dongyun Lee, Shenzhen (CN); Zhijie Zhang, Shenzhen (CN); Fei Huang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/737,596

(22) Filed: Dec. 15, 2003

(65) Prior Publication Data

US 2005/0126753 A1 Jun. 16, 2005

(30) Foreign Application Priority Data

Dec. 13, 2002 (TW) .............................. 91220201 U

(51) Int. Cl.[7] ............................ F28F 7/00; H01L 23/12

(52) U.S. Cl. ....................... 165/80.3; 165/185; 165/76; 257/719

(58) Field of Search ............................... 165/80.3, 185, 165/67, 76, 77, 79; 361/697, 702, 704, 719; 257/718–720; 174/16.3

(56) References Cited

U.S. PATENT DOCUMENTS 5,671,118 A * 9/1997 Blomquist .................. 361/704
5,870,287 A * 2/1999 Rodriguez et al. .......... 361/704
5,933,325 A * 8/1999 Hou ........................... 361/704
6,061,239 A * 5/2000 Blomquist .................. 361/704
6,082,440 A * 7/2000 Clemens et al. ........... 165/80.3
6,181,559 B1 * 1/2001 Seo ............................ 361/704
6,480,384 B2 * 11/2002 Lo ............................. 361/704
6,507,491 B1 * 1/2003 Chen .......................... 361/697
6,542,367 B2 * 4/2003 Shia et al. .................. 361/703
6,563,716 B1 * 5/2003 Truong et al. ............. 361/816
6,646,881 B1 * 11/2003 Lai et al. .................... 361/719
6,668,431 B2 * 12/2003 Franke et al. ................. 24/458
6,724,629 B1 * 4/2004 Augustin et al. ........... 361/704
6,724,632 B2 * 4/2004 Lee et al. ................... 361/719

FOREIGN PATENT DOCUMENTS

| | | |
|---|---|---|
| TW | 315007 | 9/1997 |
| TW | 328391 | 3/1998 |
| TW | 348867 | 12/1998 |
| TW | 385885 | 3/2000 |
| TW | 398641 | 7/2000 |
| TW | 456586 | 9/2001 |
| TW | 471652 | 1/2002 |
| TW | 474553 | 1/2002 |

* cited by examiner

*Primary Examiner*—Tho Duong
(74) *Attorney, Agent, or Firm*—Wei Te Chung

(57) ABSTRACT

A heat dissipation assembly includes a heat sink (20), a backplate (50), a pair of posts (60) and a fastener (10). The heat sink is attached on a CPU (30) which is mounted on a PCB (40). The backplate is disposed below the PCB. The fastener includes a main body (14) spanning on the heat sink, a resilient member (16) and an operating member (12). The posts extends through the backplate and engaged with the main body. Before the fastener is activated, the resilient member and the operating member squeezes the main body therebetween. When the fastener is activated, the operating member is above the main body. The resilient member resiliently presses the heat sink toward the CPU and the main body with opposite directional forces. The posts are consequently forced by the main body to urge the backplate against the PCB.

5 Claims, 3 Drawing Sheets

HEAT DISSIPATION ASSEMBLY WITH RESILIENT FASTENER

BACKGROUND OF THE INVENTION

1. Field of the Invention

The present invention relates to heat dissipation assemblies, and more particularly to a heat dissipation assembly including a fastener to fasten a heat sink onto a heat generating device.

2. Description of Prior Art

Electronics technology continues to boom unabated. Numerous modem electronic devices such as central processing units (CPUs) of computers operate at high speed and thus generate large amounts of heat. The heat must be efficiently removed from the CPU; otherwise, abnormal operation or damage may result. Typically, a heat dissipation assembly is mounted onto the CPU to dissipate heat therefrom.

Most commonly, a heat dissipation assembly comprises a heat sink and a fastener for attaching the heat sink to the CPU. The fastener is stamped from a metal plate, and comprises a pressing portion and a pair of legs depending from opposite ends of the pressing portion. However, the fastener needs to be quite rigid in order to provide enough retention force for the heat sink. Engagement and disengagement of the fastener are unduly laborious, and a tool is usually required to facilitate the engagement and disengagement.

To overcome the problems of the above-mentioned heat dissipation assembly, Taiwan Patent No. 328391 discloses a different kind of heat dissipation assembly. The heat sink assembly comprises a heat sink and a clip. The clip comprises a main body and a handle. The main body comprises an elongated horizontal portion, and a pair of legs depending from opposite ends of the horizontal portion. A pair of arcuate protrusions is formed outwardly and downwardly from opposite sides of a middle of the horizontal portion. The handle comprises a pressing plate for pressing the heat sink, and a pair of symmetrical side plates extending from opposite sides of the pressing plate. Each side plate comprises a sloped top edge and a substantially horizontal top edge. The pressing plate is disposed below the horizontal portion. The side plates of the handle sandwich the horizontal portion of the main body therebetween.

In use of the clip to secure the heat sink onto a CPU, the clip is placed on the heat sink with the pressing plate contacting a top surface of a base of the heat sink. The handle is partly disposed outside the heat sink and the legs are loosely engaged with a CPU socket. The handle is pushed inwardly, and the protrusions ride on the sloped top edges and then to the horizontal top edges of the side plates. Finally, the protrusions are stopped in notches defined in the side plates. Therefore, the horizontal portion of the main body is lifted by the side plates, and the legs are resiliently engaged with the CPU socket to firmly secure the heat sink on the CPU.

However, the notches of the side plates are quite shallow. The protrusions are prone to move from the notches toward the pressing plate when the assembly is subjected to shock or vibration. The legs may loosen from the CPU socket, with the clip no longer securely retaining the heat sink. The heat sink may even become unserviceable.

SUMMARY OF THE INVENTION

Accordingly, an object of the present invention is to provide a heat dissipation assembly including a fastener which easily and securely fastens a heat sink on a heat-generating device such as an electronic package.

In order to achieve the object set out above, a heat dissipation assembly in accordance with a preferred embodiment of the present invention comprises a heat sink, a backplate, a pair of posts and a fastener. The heat sink is attached on a CPU which is mounted on a PCB. The backplate is disposed below the PCB. The fastener comprises a main body spanning on the heat sink, a resilient member and an operating member. The posts extends through the backplate and engaged with the main body. Before the fastener is activated, the resilient member and the operating member squeezes the main body therebetween. When the fastener is activated, the operating member is above the main body. The resilient member resiliently presses the heat sink toward the CPU and the main body with opposite directional forces. The posts are consequently forced by the main body to urge the backplate against the PCB.

Other objects, advantages and novel features of the present invention will become more apparent from the following detailed description when taken in conjunction with the accompanying drawings, in which:

DETAILED DESCRIPTION OF THE INVENTION

Figure 1:
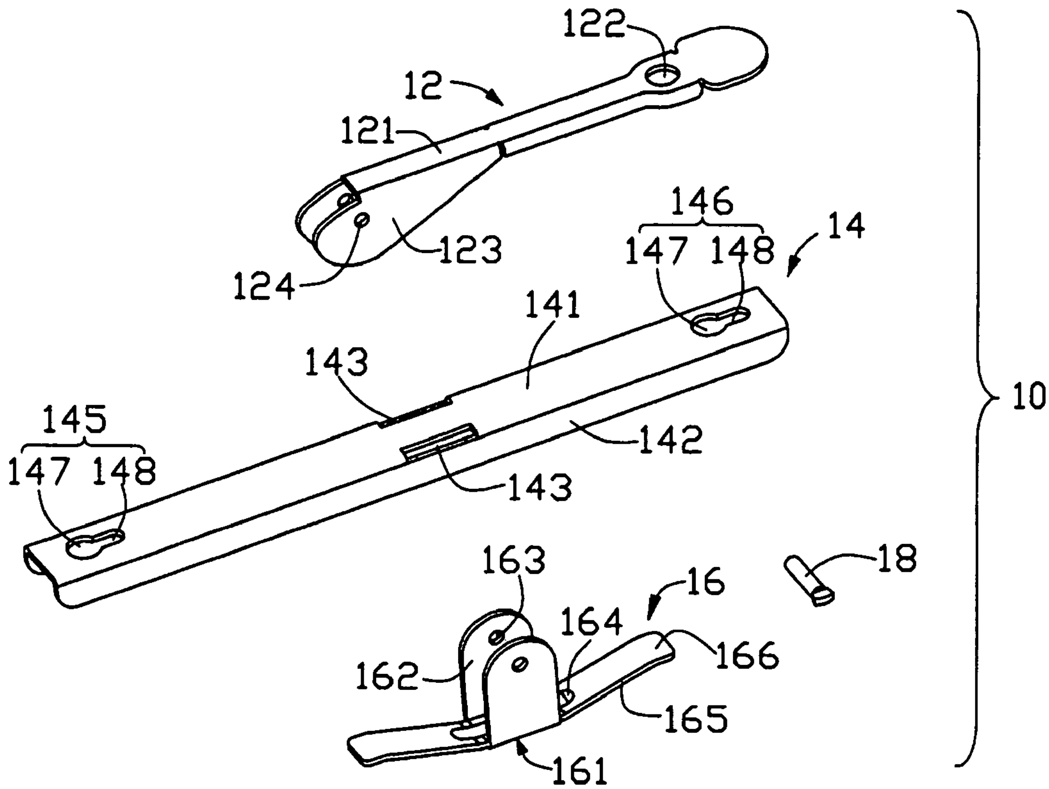
FIG. 1 is an exploded, isometric view of a fastener of a heat dissipation assembly in accordance with the preferred embodiment of the present invention.
Figure 2:
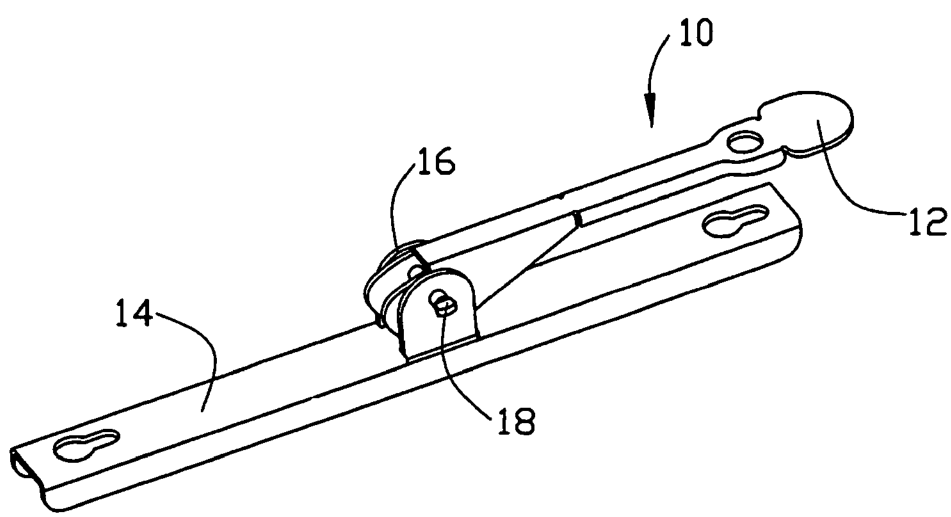
FIG. 2 is an assembled view of FIG. 1.
Figure 3:
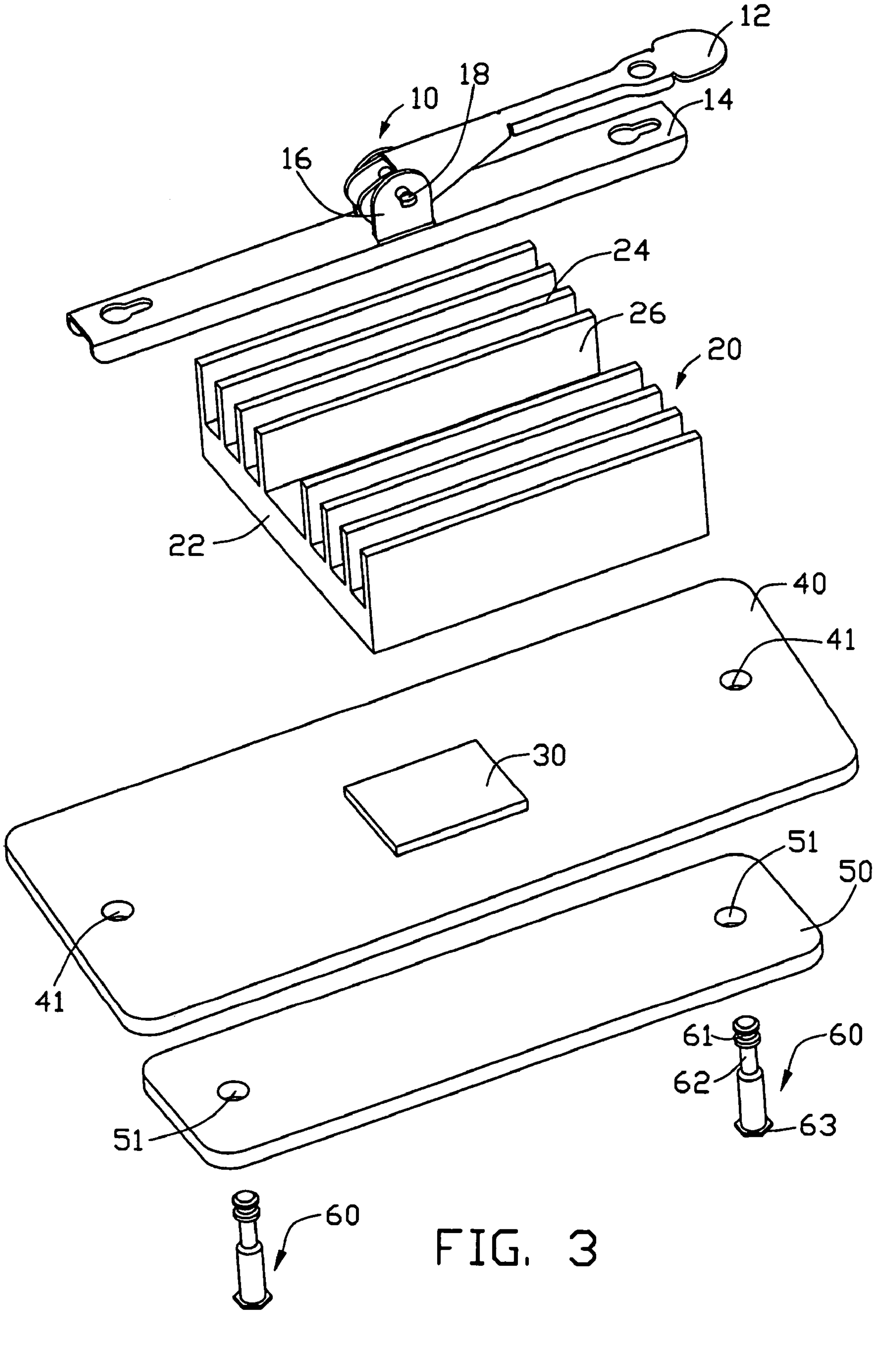
FIG. 3 is an exploded, isometric view of the heat dissipation assembly in accordance with the preferred embodiment of the present invention.

Referring to FIGS. 1–3, a heat dissipation assembly in accordance with the preferred embodiment of the present invention comprises a fastener 10, a heat sink 20, an electronic package such as a central processing unit (CPU) 30, a printed circuit board (PCB) 40, a backplate 50 and a pair of posts 60. The heat sink 20 is attached on the CPU 30, which is mounted on a top side of the PCB 40. The backplate 50 is attached on an opposite bottom side of the PCB 40, for protecting the PCB 40 from being damaged. The posts 60 are extended through the backplate 50 and the PCB 40 and engaged with the fastener 10 in order to compress the heat sink 20 between the fastener 10 and the PCB 40. The heat sink 20 can then efficiently remove heat from the CPU 30.

The heat sink 20 comprises a base 22, and a plurality of fins 24 extending upwardly from the base 22. A lateral channel 26 is defined in the heat sink 20 between two inmost of the fins 24.

The fastener 10 comprises an operating member 12, an elongated main body 14, and a resilient member 16. The main body 14 and the resilient member 16 are made of metallic materials. The operating member 12 can be made of metallic material, plastic or another suitable material. The operating member 12 comprises a handle 121 for facilitating rotation thereof. An orienting hole 122 is defined in an end of the handle 121. A pair of parallel cam-shaped adjusting plates 123 depends from opposite lateral edges of an opposite end of the handle 121 respectively. A pair of aligned first pivot holes 124 is defined in the adjusting plates 123 respectively, adjacent said opposite end of the handle 121. A distance from each first pivot hole 124 to any point on an edge of the corresponding adjusting plate 123 is different from a distance from the first pivot hole 124 to any other point on the edge of the adjusting plate 123.

The main body 14 comprises an elongated horizontal plate 141, and a pair of flanges 142 depending from opposite lateral edges of the horizontal plate 141 respectively. A pair of parallel slots 143 is defined in a middle portion of the horizontal plate 141, where the horizontal plate 141 adjoins the flanges 142 respectively. First and second locking holes 145, 146 are defined in opposite end portions of the horizontal plate 141 respectively. Each first and second locking hole 145, 146 comprises a wide portion 147, and a narrow portion 147 in communication with the wide portion 147. The wide portion 147 of the first locking hole 145 is nearer the corresponding end of the horizontal plate 141 than its adjoining narrow portion 148. The wide portion 147 of the second locking hole 146 is more distant from the corresponding end of the horizontal plate 141 than its adjoining narrow portion 148.

The resilient member 16 comprises a bottom pressing portion 161 having a reinforcing rib 164 formed thereon, and a pair of parallel pivot plates 162 extending perpendicularly upwardly from opposite lateral edges of a central part of the pressing portion 161 respectively. Each pivot plate 162 defines a second pivot hole 163 in a top portion thereof. The pivot plates 162 are insertable through the slots 143 of the main body 14. The resilient member 16 further comprises a pair of spring portions 165 extending outwardly and upwardly from opposite ends of the pressing portion 161 respectively. An abutting tab 166 is integrally formed at a distal end of each spring portion 165. A pivot pin 18 is insertable through the first and second pivot holes 124, 163 respectively of the operating member 12 and the resilient member 16.

The PCB 40 defines a pair of bores 41 in opposite ends thereof respectively. The backplate 50 defines a pair of apertures 51 in opposite ends thereof respectively, the apertures 51 corresponding to the bores 41. Each post 60 defines an annular orienting groove 61 in a top end thereof, and an annular locking groove 62 slightly below the orienting groove 61. Each post 60 comprises a bottom blocking end 63.

In assembly of the fastener 10, the pivot plates 162 of the resilient member 16 are inserted through the slots 143 of the main body 14. The first and second pivot holes 124, 163 respectively of the operating member 12 and the resilient member 16 are aligned with each other. The pivot pin 18 is inserted through the first and second pivot holes 124, 163, thereby pivotably attaching the operating member 12 to the resilient member 16. Edges of the adjusting plates 123 contact a top surface of the horizontal plate 141 between the slots 143. The operating member 12 is rotated to be parallel to the horizontal plate 141, with the handle 121 disposed above the second locking hole 146. Because the adjusting plates 123 are cam-shaped, the pressing portion 161 is pulled upwardly, the spring portions 165 are resiliently deformed, and the abutting tabs 166 resiliently press a bottom surface of the horizontal plate 141. In this position, the fastener 10 is under tension, with the adjusting plates 123 and the abutting tabs 166 resiliently pressing the top and bottom surfaces of the horizontal plate 141 respectively.

Figure 4:
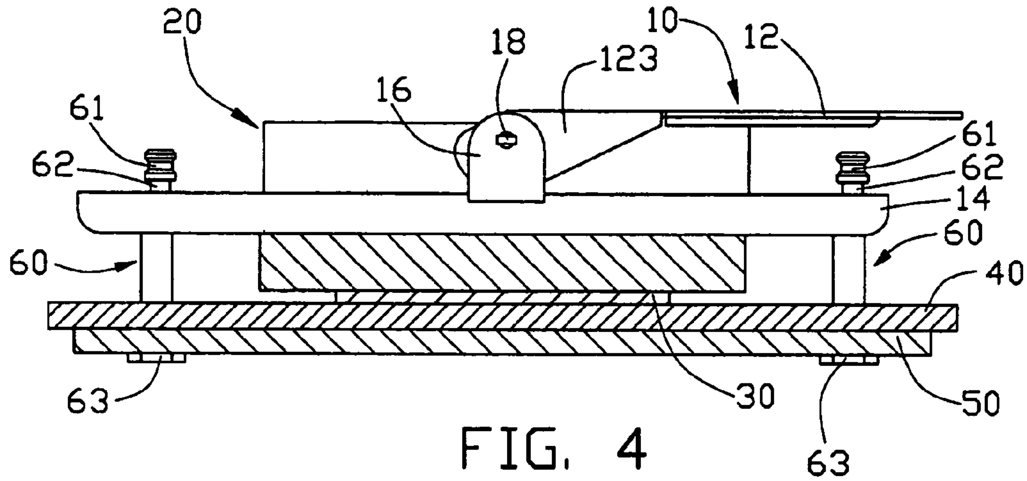
FIG. 4 is an assembled, cross-sectional view of the heat dissipation assembly of FIG. 3, showing the heat dissipation assembly in an unlocked state.

Referring also to FIG. 4, in assembly of the heat dissipation assembly, the posts 60 are extended up through the apertures 51 and the bores 41. The heat sink 20 is placed on the CPU 30. The fastener 10 is placed in the channel 26 of the heat sink 20, with the posts 60 being received through the wide portions 147 of the first and second locking holes 145, 146. In this position, the locking grooves 62 are disposed in the wide portions 147. The main body 14 is pushed horizontally to cause the posts 60 at the locking grooves 62 to be slidingly engaged in the narrow portions 148 of the first and second locking holes 145, 146. Even though the fastener 10 itself is under tension, the fastener 10 exerts no force on other parts of the heat dissipation assembly.

Figure 5:
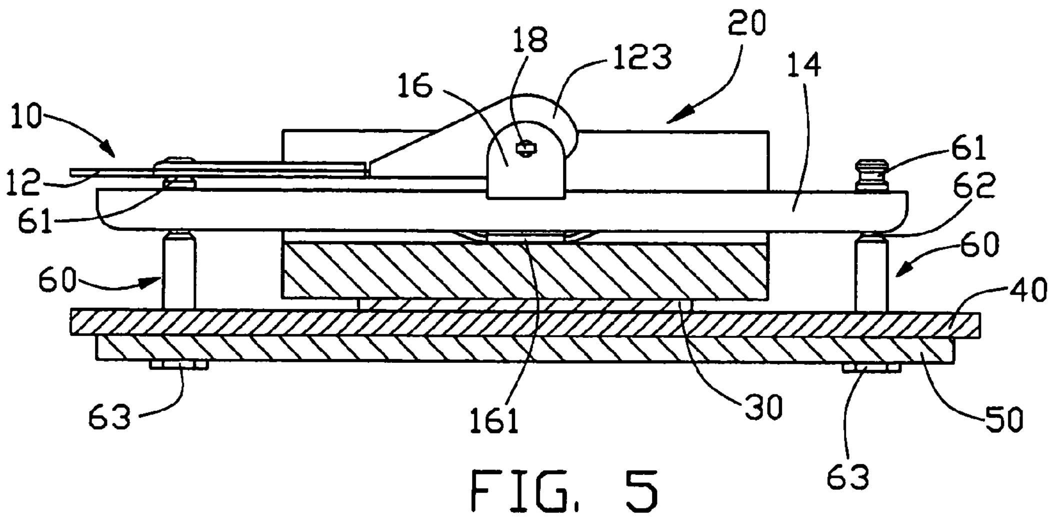
FIG. 5 is similar to FIG. 4, but showing the heat sink dissipation assembly in a locked state.

Referring also to FIG. 5, the operating member 12 is then rotated up about the pivot pin 18 toward the first locking hole 145. Because the adjusting plates 123 are cam-shaped, the adjusting plates 123 are moved away from contact with the main body 14. The spring portions 165 rebound toward their original shapes, and drive the abutting tabs 166 to urge the main body 14 upwardly. Simultaneously, the spring portions 165 drive the pressing portion 161 to urge the heat sink 20 downwardly. The horizontal plate 141 of the main body 14 presses upwardly on the posts 60 at upper extremities of the locking grooves 62. The heat sink 20 presses downwardly on CPU 30. As a result, the blocking ends 63 of the posts 60 press a bottom surface of the backplate 50, and urge the backplate 50 against the PCB 40. Finally, the orienting hole 122 of the operating member 12 receives the left-hand post 60, and the handle 121 of the operating member 12 is engaged with the left-hand post 60 in the orienting groove 61 thereof. At this position, the fastener 10 exerts substantially equal forces on the heat sink 20 and on the posts 60, but in opposite directions. The posts 60 translate parts of the forces exerted thereon to upward forces exerted on the backplate 50, the PCB 40 and the CPU 30. Thus, the heat sink 20 and the CPU 30 are urged together by opposite and substantially equal forces, such that the heat sink 20 is securely retained on the CPU 30.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation assembly comprising:

a heat generating device;

a backplate underlying the heat generating device;

a heat dissipating device disposed on the heat generating device;

a fastener comprising a main body, an operating member which resiliently presses the main body and is movable away from contact with the main body, a resilient member pivotably attached to the operating member and further resiliently urging the heat dissipating device downwardly and moving the main body upwardly when the operating member is moved away from contact with, the main body; and a pair of posts extending through the backplate and the main body of the fastener, and being upwardly pressed by the main body when the operating member is moved away from contact with the main body.

2. The assembly of claim 1, wherein the heat generating device comprises an electronic package and a circuit substrate supporting the electronic package, the posts extend through the circuit substrate.

3. The assembly of claim 1, wherein the main body defines a pair of locking holes at opposite ends, the posts each define a locking groove therein, and the posts are engaged in the locking holes at the locking grooves.

4. The assembly of claim 3, wherein the posts each form a blocking end distal from the locking groove, the blocking end abutting against the backplate.

5. The assembly of claim 4, wherein the operating member defines an orienting hole at an end portion thereof, the posts each define an orienting groove therein above the locking groove, and the orienting hole receives one of the posts at the orienting groove thereof.

* * * * *